Jan. 5, 1971 J. R. GLASSER 3,553,601

TRANSISTOR DRIVER CIRCUIT

Filed Feb. 10, 1969

INVENTOR
JAMES R. GLASSER
BY
Mueller, Aichele and Rauner
ATTYS.

3,553,601
TRANSISTOR DRIVER CIRCUIT

James R. Glasser, Naperville, Ill., assignor to Motorola, Inc., Franklin Park, Ill., a corporation of Illinois

Filed Feb. 10, 1969, Ser. No. 798,023
Int. Cl. H03f *3/04*
U.S. Cl. 330—24 2 Claims

ABSTRACT OF THE DISCLOSURE

A transistor amplifier circuit is provided for operation as a class B amplifier and which has a voltage swing capability which is as close as possible to the supply voltage. The transistors used are all of the same polarity type so that the circuit may be easily manufactured as an integrated circuit. The circuit provides an emitter follower output amplifier having a transistor coupled in the reverse direction between its emitter and base and biased to saturation to provide a path for current flow when the emitter follower transistor is cutoff.

BACKGROUND OF THE INVENTION

A problem that is frequently encountered in R-C coupled amplifier design is that of driving a capacitive load with a fast rise time without drawing excessive average current in the grounded emitter configuration. When the grounded emitter amplifier is turned off the rise time is often limited by the R-C time constant of the collector resistor and an assumed capacitive load. One solution is to decrease the collector resistor but this increases the current drawn through the transistor when it is in the "on" condition and the current drain thus can become excessive.

Another solution to this problem is to have the grounded emitter stage drive an emitter follower which turns on when the grounded emitter stages is off and turns off when the grounded emitter stage is on. A diode is connected between the base and emitter of the emitter follower stage with its polarity reversed to that of the base-emitter polarity of the emitter follower transistor. When the voltage at the collector of the grounded emitter stages rises one $V_{BE}$ above the voltage of the capacitive load, the emitter follower stage conducts and the diode is reversed biased. When the voltage at the collector of the emitter follower stage drope one $V_{BE}$ below that of the load, the diode conducts and the emitter follower stage is reversed biased. Thus charge is added to the load by either the emitter follower transistor or the diode and is removed by the other of the two. The collector-resistor of the grounded emitter stage can be large so class B efficiency can be approached.

There are two undesirable features of this circuit. First the collector voltage must rise one $V_{BE}$ before the charge can be added to the load, and must drop one $V_{BE}$ before it can be removed from the load. Second, the load can only be pulled down to one $V_{BE}$ plus one $V_{sat}$ above ground. The $V_{BE}$ limitation can significantly reduce the voltage swing of the amplifier.

SUMMARY OF THE INVENTION

It is, therefore, an object of this invention to provide a driver circuit operating as a class B stage in which the minimum load voltage is two $V_{sat}$.

Another object of this invention is to provide a class B driver having reduced current requirements.

Another object of this invention is to provide a class B driver circuit in which an input change of $V_{sat}$ only is required to change the output potential of the capacitive load.

Another object of this invention is to provide a class

B driver circuit having transistors of the same polarity type whereby the circuit may be easily integrated.

In practicing this invention a class B driver circuit is provided having a grounded emitter input stage coupled to an emitter follower output stage. A third transistor is provided with its collector coupled to the emitter of the emitter follower and its emitter connected to the collector of the grounded emitter stage. All three transistors are of the same polarity type. The base electrode of the third transistor is coupled by a resistor to the power supply to provide a bias potential therefor sufficient to bias the third transistor to saturation when the first transistor is conducting. A diode poled to conduct current in the same direcion as the grounded emitter input stage may be coupled in between the collector of grounded emitter stage and base electrode of the emitter follower in order to compensate for the $V_{BE}$ drop of the emitter follower stage. In order to provide greater gain a series of emitter follower stages may be coupled together and a plurality of diodes equal to the number of emitter follower stages used in series between the collector of the grounded emitter stage and the base of the input emitter follower in order to compensate for the $V_{BE}$ drops of all the emitter follower stages.

The invention is illustrated in the drawings of which:

DESCRIPTION OF THE INVENTION

Figure 1:
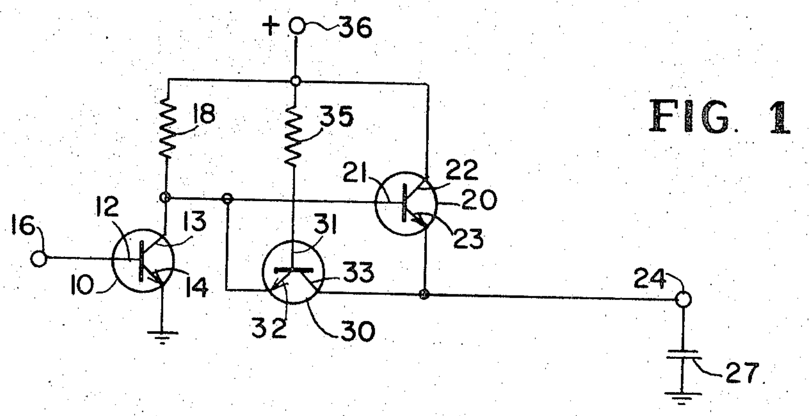
FIG. 1 is a schematic of one embodiment of the invention.

An input terminal 16 receives the input signal which is to be amplified and couples it to base 12 of transistor 10. Emitter 14 of transistor 10 is connected to ground and collector 13 is connected to the potential supply terminal 36 through resistor 18. Transistor 10 is biased so that the incoming signal operates the stage as a class B amplifier, that is, the stage alternately is biased to conduction and nonconduction.

The output of transistor 10 is coupled from collector 13 to base 21 of transistor 20. Collector 22 of transistor 20 is coupled directly to the power supply terminal 36 and emitter 23 is connected to output terminal 24 so that transistor 20 acts as an emitter follower amplifier. With the two stages thus described, that is, transistors 10 and 20, the output potential across capacitor 27 will not change as the input signal changes but will be dependent upon the time constant of the load. For example, with transistor 10 biased to non-conduction, transistor 20 would be biased to conduction and capacitor 27 would charge to a potential equal to $V - V_{BE}$ with $V_{BE}$ being the base 21 to emitter 23 diode voltage drop and V the supply voltage. With transistor 10 biased to conduction, the potential on base 21 of transistor 20 would drop to a value less than the potential stored in capacitor 27. This reverse biases the base-emitter diode of transistor 20 and the charge on capacitor 27 would have to be dissipated through the load. If the resistance of the load is high the charge on capacitor 27 would remain essentially constant and there would be no change in output signal or change in input signal.

In order to provide for proper operation of a class B amplifier of the type described, in prior art circuits a diode has been connected between emitter 23 and collector 13 with the diode poled in a direction opposite to the base 21 emitter 23 diode of transistor 20. With this diode and with transistor 10 biased to conduction, the voltage at the capacitor 27 changes as the input signal changes since charge can be removed through the diode and transistor 10. However, with a diode, the minimum load voltage would be $V_{sat}$ plus $V_{BE}$ above ground.

In order to reduce this minimum load voltage the circuit of FIG. 1 includes a transistor 30 having its collector 33 coupled to emitter 23 of transistor 20 and its emitter 32 connected to collector 13 of transistor 10. Base 31 of transistor 30 is coupled to the supply terminal 36 through current limiting resistor 35. In operation, with transistor 10 biased to nonconduction transistor 20 is biased to conduction and transistor 30 is biased to nonconduction. Capacitor 27 charges as previously described through the conducting emitter follower transistor 20. When transistor 10 is biased to conduction transistor 20 is biased to nonconduction as previously described. However, at this point the potential at emitter 32 drops with respect to the potentian at base 31 so that transistor 30 is conducting. Sufficient bias current is applied from the potential supply terminal 36 to base 31 to bias transistor 30 to saturation so that the discharge path for capacitor 27 is through the collector-emitter electrodes of transistor 30 and the collector and emitter electrodes of transistor 10. Under these conditions the minimum load voltage is 2 $V_{sat}$ above ground.

The reduction of the minimum load voltage from $V_{sat}$ plus $V_{BE}$ to two $V_{sat}$ provides an appreciable improvement which is particularly important when power supplies of low voltage are used. For example, with silicon transistors $V_{BE}$ is of the order of 0.7 volt or more while $V_{sat}$ is less than 0.2 volt. Thus $V_{sat}$ plus $V_{BE}$ would be equal to 0.9 volt while 2 $V_{sat}$ would be less than 0.4 volt. When power supply voltages of the order of 1.5 to 3 volts are used it can be seen that this reduction in minimum load voltages is very significant.

Figure 2:
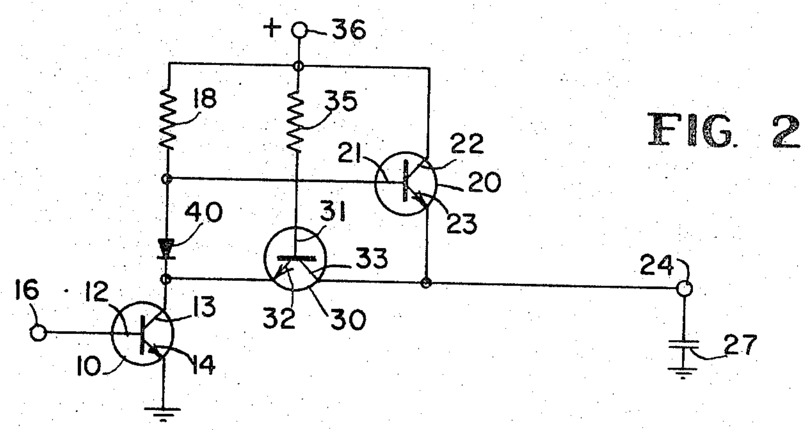
FIG. 2 is a schematic of the embodiment of FIG. 1 further incorporating a diode in the collector circuit of the input transistor.

While the circuit of FIG. 1 produces a significant improvement in the operation of the amplifier, the amplifier can be further improved by the circuit of FIG. 2. In the circuit of FIG. 1 the voltage at the load cannot be increased until the voltage at collector 13 of transistor 10 is raised by one $V_{BE}$ above the voltage at terminal 24. In order to reduce this voltage requirement a diode 40 is connected in series with collector 13 and resistor 18 and poled to conduct current in the same direction as transistor 10. With diode 40 in the circuit the voltage at base 21 of transistor 20 is $V_{BE}$ above the voltage at collector 13 to compensate for the base 21 emitter 23 $V_{BE}$ voltage drop of transistor 20. With diode 40 in the circuit the load will react almost instantly to any change in the collector voltage of transistor 10.

Figure 3:
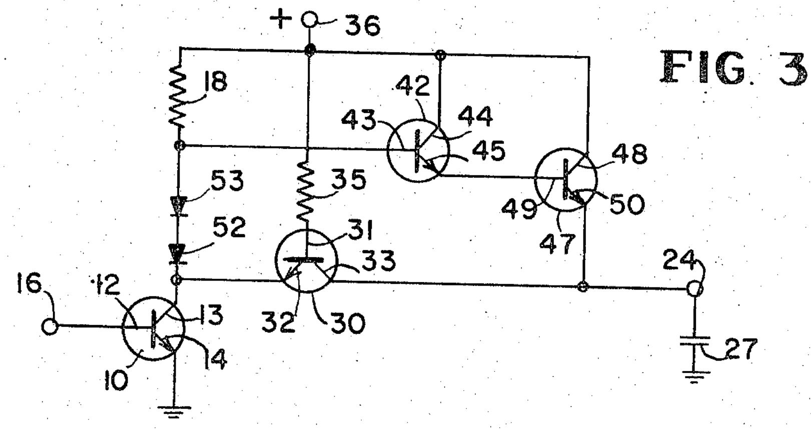
FIG. 3 is a schematic of the circuit of FIG. 2 and further having a plurality of output amplifiers and a plurality of diodes in the collector circuit of the input transistor.

In the circuit of FIG. 3 a pair of emitter follower transistors 45 and 47 are coupled in series to provide increased gain. Collectors 44 and 48 are connected to the power supply potential and emitter 45 of transistor 42 is connected to base 49 of transistor 47. Base 43 of transistor 42 is connected to the junction between diode 53 and resistor 18 and emitter 50 is connected to the output terminal 24. A pair of diodes 52 and 53 are connected in series with collector 13 of transistor 10 so that the potential at the junction of resistor 18 and diode 53 is 2 $V_{BE}$ above the potential at collector 13. This compensates for the base-emitter diode drop through transistors 42 and 47 so that the potential at the load reacts instantly to any change in the collector voltage of the transistor 10.

I claim:

1. A transistor amplifier circuit including in combination, an input terminal and an output terminal, a first transistor having an emitter electrode coupled to a first reference potential, a base electrode coupled to said input terminal and a collector electrode, a plurality of second transistors including an input transistor and an output transistor, each of said plurality of second transistors having collector electrodes connected to a second reference potential, said plurality of second transistors having emitter-to-base paths connected in series with the emitter of each of said plurality of second transistors being connected to the base of the next one of said plurality of second transistors in said series, said emitter electrode of said output transistor being coupled to said output terminal, a plurality of diodes equal in number to said plurality of second transistors connected in series with said collector electrode of said first transistor and poled to conduct current in the same direction as the path through said emitter and collector electrodes of said first transistor, first resistance means connecting said series of diodes to said second reference potential, said base electrode of said input transistor being connected to the junction of said series of diodes and said first resistance means, a third transistor having a collector electrode coupled to said emitter electrode of said output transistor, an emitter electrode coupled to said collector electrode of said first transistor and a base electrode, second resistance means connecting said base electrode of said third transistor to said second reference potential, whereby said third transistor is biased to saturation with said first transistor biased to conduction, all of said transistors being of the same polarity type, said diodes compensating for the base-emitter drops of said second transistors so that the potential at said output terminal reacts to any change in the voltage at said collector electrode of said first transistor resulting from a change at said input terminal.

2. A transistor amplifier circuit, including in combination, an input terminal and an output terminal, a first transistor having an emitter electrode coupled to a first reference potential, a base electrode coupled to said input terminal and a collector electrode, first circuit means including a diode having a first electrode coupled to said collector electrode of said first transistor and a second electrode and first resistance means coupling said second electrode of said diode to a second reference potential, transistor amplifier means including a second transistor having a base electrode coupled to the junction of said second electrode of said diode and said first resistance means, a collector electrode coupled to said second reference potential, and an emitter electrode coupled to said output terminal, said diode being poled to conduct current in the same direction as the path through said emitter and collector electrodes of said first transistor and compensating for the base-emitter voltage drop of said second transistor so that the potential at said output terminal reacts to any change in the voltage at said collector electrode of said first transistor, third transistor having a collector electrode coupled to said output terminal, an emitter electrode coupled to said collector electrode of said first transistor and a base electrode, second circuit means coupling said base electrode of said third transistor to said second reference potential for applying a bias current to said second transistor to bias the same to saturation with said first transistor biased to conduction, said first, second and third transistors being of the same polarity type.

References Cited

UNITED STATES PATENTS 3,275,854 9/1926 Cianciola ---------- 307—300X

ROY LAKE, Primary Examiner

J. B. MULLINS, Assistant Examiner

U.S. Cl. X.R.

307—214, 270; 330—19, 32